(12) United States Patent
Xu et al.

(10) Patent No.: US 8,900,909 B2
(45) Date of Patent: Dec. 2, 2014

(54) MANUFACTURE METHOD OF SENSOR

(71) Applicant: Beijing Boe Optoelectronics Technology Co., Ltd., Beijing (CN)

(72) Inventors: Shaoying Xu, Beijing (CN); Zhenyu Xie, Beijing (CN); Xu Chen, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/704,769

(22) PCT Filed: Nov. 8, 2012

(86) PCT No.: PCT/CN2012/084334
§ 371 (c)(1),
(2), (4) Date: Dec. 17, 2012

(87) PCT Pub. No.: WO2013/078941
PCT Pub. Date: Jun. 6, 2013

(65) Prior Publication Data
US 2013/0143350 A1   Jun. 6, 2013

(30) Foreign Application Priority Data
Dec. 2, 2011 (CN) .......................... 2011 1 0397822

(51) Int. Cl.
*H01L 21/00* (2006.01)
*H01L 27/146* (2006.01)
*H01L 31/18* (2006.01)

(52) U.S. Cl.
CPC .......... *H01L 31/18* (2013.01); *H01L 27/14692* (2013.01); *H01L 27/14658* (2013.01)
USPC .......................................... 438/65

(58) Field of Classification Search
USPC ............ 438/65, 98, 73; 257/66, 72, E29.273, 257/E33.053, 292
See application file for complete search history.

(56) References Cited

U.S. PATENT DOCUMENTS

| | | | |
|---|---|---|---|
| 2005/0258337 A1 | 11/2005 | Ozawa | |
| 2008/0245968 A1* | 10/2008 | Tredwell et al. | 250/370.09 |
| 2011/0127593 A1* | 6/2011 | Hayashi | 257/292 |

FOREIGN PATENT DOCUMENTS

| | | |
|---|---|---|
| CN | 101350357 A | 1/2009 |
| CN | 101533867 A | 9/2009 |

(Continued)

OTHER PUBLICATIONS

International Search Report: dated Feb. 21, 2013; PCT/CN2012/084334.
First Chinese Office Action dated Mar. 4, 2014; Appln. No. 201110397622.4.

(Continued)

*Primary Examiner* — Jarrett Stark
*Assistant Examiner* — Shahed Ahmed
(74) *Attorney, Agent, or Firm* — Ladas & Parry LLP

(57) ABSTRACT

An embodiment of the invention discloses a manufacture method of a sensor comprising: preparing gate scanning lines on a substrate; depositing a gate insulating layer on the gate scanning lines; sequentially depositing a gate insulation thin film, an active layer thin film, an ohmic contact layer thin film, a first conducting layer thin film and a photoelectric conversion layer thin film, and after the depositing, processing a lamination structure of the thin films with a gray-tone mask plate to obtain switch devices and photoelectric sensing devices; and then sequentially preparing a first passivation layer, bias lines and a second passivation layer.

14 Claims, 8 Drawing Sheets

(56) References Cited

FOREIGN PATENT DOCUMENTS

| | | | |
|---|---|---|---|
| CN | 101572245 A | 11/2009 |
| CN | 101656232 A | 2/2010 |
| CN | 101900825 A | 12/2010 |
| CN | 102024808 A | 4/2011 |
| CN | 102629613 A | 8/2012 |

OTHER PUBLICATIONS

International Preliminary Report on Patentability dated Jun. 3, 2014; PCT/CN2012/084334.

Second Chinese Office Action Issued Aug. 28, 2014; Appln. No. 201110397822.4.

* cited by examiner

MANUFACTURE METHOD OF SENSOR

TECHNICAL FIELD

An embodiment of the invention relates to a manufacture method of a sensor.

BACKGROUND

With development of society and advance of science and technology, X-Ray sensors not only play an important role in the field of medical imaging, but are widely applied in other fields such as metal detection.

A conventional plane-type X-Ray sensor comprises a photosensitive array, the circuit structure of which is shown in FIG. 1. Each of the pixel units of the photosensitive array of the X-Ray sensor comprises a photodiode 11 and a thin film transistor (TFT) 12. The gate electrode of the TFT 12 is connected to a gate scanning line 13 of the X-Ray sensor, the drain electrode of the TFT 12 is connected to a data line 14 of the X-Ray sensor, and the source electrode of the TFT 12 is connected to the photodiode 11. One end of the gate scanning line 13 is connected to a scan driving circuit 16 through a connecting pin; one end of the data line 14 is connected to a data driving circuit 15 through a connecting pin.

The X-Ray sensor scans the gate signals through the scan driving circuit 16 to control the switch states of the TFTs 12 of a row of pixel units. When the TFT 12 of one pixel unit is switched on, the photocurrent signal generated by the photodiode 11 is read out sequentially through the data line 14 connected to the TFT 12 and the data driving circuit 15. The collection of the photoelectric signal is accomplished by controlling the signal timings on the gate scanning line 13 and the data line 14. That is to say, the controlling operation on the collection of the photocurrent signal generated by the photodiode 11 is accomplished by controlling the switch state of the TFT 12.

A cross-sectional view of one pixel unit in the conventional X-Ray sensor is shown in FIG. 2. Each of the pixel units sequentially from the bottom up comprises: a substrate 21, a gate layer 22, a gate insulating layer 23, an active layer 24, a source/drain electrode layer 25, a first passivation layer 26, a photoelectric conversion layer 27, an etched protection layer 28, a second passivation layer 29, a common electrode layer 30, a light blocking layer 31 and a protection layer 32. The common electrode layer 30 and the source/drain electrode layer 25 act as the two electrodes of the photodiode 11. The active layer 24 comprises an intrinsic amorphous silicon layer 241 and an n-type amorphous silicon layer 242. In a conventional preparing method, during the process of etching to form each of the gate layer 22, the gate insulating layer 23, active layer 24, the source/drain electrode layer 25, the first passivation layer 26, the photoelectric conversion layer 27, the etch protection layer 28, the second passivation layer 29, the common electrode layer 30, the light blocking layer 31 and the protection layer 32, one mask exposure process is required, and therefore the X-Ray sensor totally requires 11 photolithography processes (mask processes) during the process of manufacture, and correspondingly 11 mask plates are used for exposing photoresist.

Thus, in the conventional method for manufacturing the X-Ray sensor, the number of mask exposure is great and the manufacturing processes are very complex; furthermore, due to the high cost of a mask plate, the corresponding products have increased manufacturing costs, reduced yield and reduced productivity of equipments.

SUMMARY

An embodiment of the invention provides a manufacturing method of a sensor to solve the problems of high costs of products, low yield and low productivity of equipments due to the excessive number of mask exposing during the process of manufacturing an X-Ray sensor for example.

An embodiment of the invention provides a manufacture method of a sensor comprising a plurality of pixel units arranged in an array, each of which comprises a switch device and a photoelectric sensing device, the method comprising:

preparing at least two gate scanning lines and gate electrodes of the switch devices of a row of pixel units connected to each of the gate scanning line respectively on a substrate;

depositing a gate insulation thin film, an active layer thin film, an ohmic contact layer thin film, a first conducting layer thin film, and a photoelectric conversion layer thin film on the substrate and the gate scanning line sequentially; processing a lamination structure of the active layer thin film, the ohmic contact layer thin film, the first conducting layer thin film and the photoelectric conversion layer thin film using a gray-tone photolithography process to obtain at least two data lines intersecting the gate scanning lines, the photoelectric sensing device and the switch device, each of the data lines is connected to drain electrodes of the switch devices of a column of the pixel units in the sensor, and source electrodes of the switch devices are connected to negative electrodes of photoelectric sensing devices;

preparing a first passivation layer covering the photoelectric sensing devices and the switch devices, and preparing via holes on the first passivation layer, which are located at predetermined positions in regions of the photoelectric sensing devices;

preparing bias lines at positions corresponding to the data lines and the switch devices on the first passivation layer, which are connected to the photoelectric sensing devices through the via holes; and preparing a second passivation layer covering the bias lines and the first passivation layer.

The embodiment of the invention provides a manufacture method of a sensor, the steps of which may be completed with 5 mask plates, so that compared to the prior art in which 11 mask plate are required to prepare a sensor, the method reduces product costs; since the number of mask plates used is reduced, the processing steps are reduced correspondingly, which reduces damage rate of products, i.e., failure rates, so as to enhance yield and productivity of equipments.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An embodiment of the invention provides a sensor such as an X-Ray sensor and a manufacture method thereof with respect to the problem that the number of mask exposing is large to make the product costs high, yield low and productivity of equipments low during the process of manufacturing an X-Ray sensor.

An X-Ray sensor of the embodiment of the invention comprises a photosensitive array which comprises a plurality of pixel units arranged as an array, each of which comprises a photoelectric sensing device and a switch element. In the description hereinafter, the photoelectric sensing device and the switch element belong to same one pixel unit.

Figure 3:
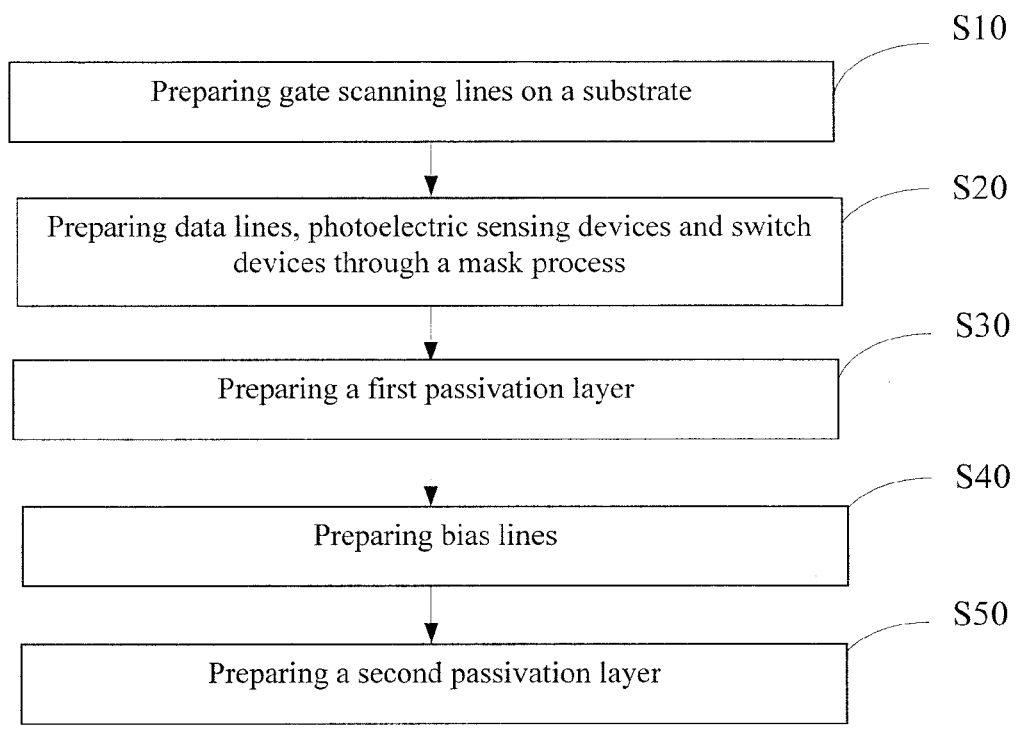
FIG. 3 is a preparing flowchart of an X-Ray sensor in an embodiment of the invention.

A manufacture method of the X-Ray sensor provided by an embodiment of the invention, the flowchart of which is shown as in FIG. 3, comprises the following steps.

Step S10: preparing at least two gate scanning lines and gate electrodes of switch devices connected thereto on a substrate. For example, parts of each of the gate scanning lines serve as the gate electrodes of the switch devices included in a row of pixel units in the X-Ray sensor; or the gate electrodes may be prepared individually, for example, branched from the corresponding gate line for each pixel unit. Therefore, each of the gate scanning lines is connected to the gate electrodes of the switch devices of a row of pixel units.

Step S20: sequentially depositing a gate insulation thin film, an active layer thin film, an ohmic contact layer thin film, a first conducting layer thin film and a photoelectric conversion layer thin film on the gate scanning lines and the gate electrodes on the substrate to obtain a lamination structure of these thin films. A gray-tone photolithography process (mask process) is used for processing the lamination structure of the active layer thin film, the ohmic contact layer thin film, the conducting layer thin film and the photoelectric conversion layer thin film structure, to obtain at least two data lines intersecting the gate scanning lines, photoelectric sensing devices and switch devices. For example, parts of each of the data lines serve as drain electrodes of the switch devices included in a column of pixel units in the X-Ray sensor; or, the drain electrode may be prepared individually, which is branched from the corresponding data line, for each of the pixel units. Therefore, each of the data lines is connected to the drain electrodes of a column of pixel units. Source electrodes of the switch devices are connected to negative electrodes of the photoelectric sensing devices.

Step S30: preparing a first passivation layer covering the photoelectric sensing devices and the switch devices and preparing via holes on the first passivation layer at predetermined positions in regions of photoelectric sensing devices.

Step S40: preparing bias lines, which are electrically connected to the photoelectric sensing devices through the via holes, at the positions corresponding to the data lines and the switch devices on the first passivation layer.

The aforesaid bias lines are used as common electrodes, connecting the same electrodes of all photoelectric sensing device prepared.

Step S50: preparing a second passivation layer covering the bias lines and the first passivation layer.

After completing the above five steps, one end of each gate scanning line in the photosensitive array is connected to a scan driving circuit through a pin, and one end of each data line is connected to a data driving circuit through a pin, so as to obtain one X-Ray sensor.

For example, the photoelectric sensing device of the X-Ray sensor described above is a photodiode. For example, the switch device is a thin film transistor.

Figure 4:
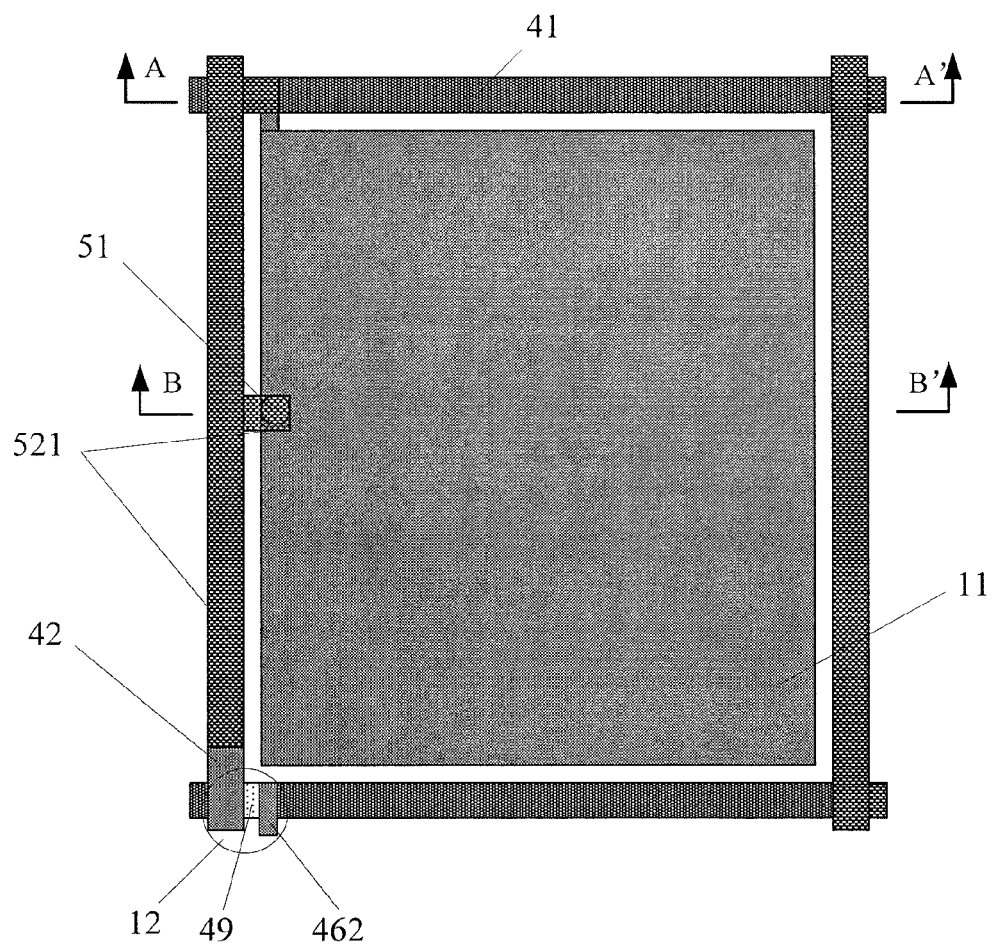
FIG. 4 is a top view of one pixel unit of the X-Ray sensor in the embodiment of the invention.

The photosensitive array of the X-Ray sensor is an array composed of a plurality of pixel units. FIG. 4 shows a top view of one pixel unit of the X-Ray sensor. The gate scanning lines 41 are provided parallel to each other horizontally, the data lines 42 are provided perpendicular to the gate scanning line 41, and a region defined by the intersecting of the gate scanning line 41 and the data lines 42 with each other is that for the photoelectric sensing device in the pixel unit. The photoelectric sensing device shown in the figure is a photodiode 11. The switch device is a thin film transistor 12 located at the position where the data lines 42 and the gate scanning line 41 intersect. In FIG. 4, the switch device (thin film transistor) 12 under the bias line is located at the left lower corner.

The steps of one example of the method for manufacturing an X-Ray sensor of the invention using five mask plates will be explained in detail in combination with FIG. 5 to FIG. 13 taking a photodiode as the photoelectric sensing element and a thin film transistor as the switch element for examples. In FIG. 4, the cross-sectional view at A-A' position is for illustrating a structure of the switch device, and the cross-sectional view at B-B' position is for illustrating a structure of the photoelectric sensing device. The structure of the switch device is different from the structure of the photoelectric sensing device, thus the explanation will be made respectively for the cross-sectional views at A-A' and B-B' positions in each step.

First Photolithography Process

Figure 5:
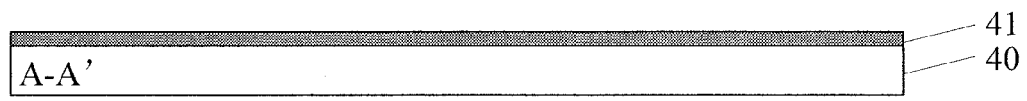
FIG. 5 is a cross-sectional view at A-A' and B-B' positions after preparing a gate scanning line in the embodiment of the invention.
Figure 5:
Figure 6:
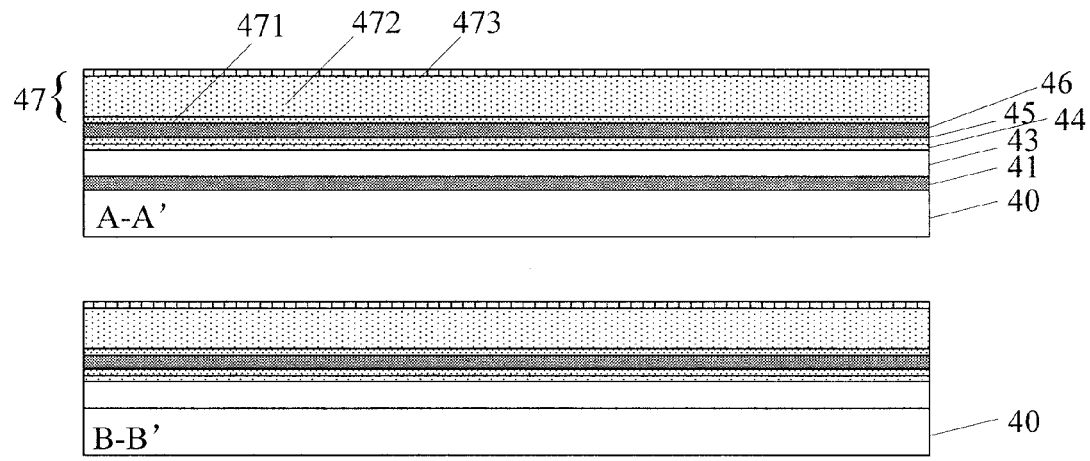
FIG. 6 is a cross-sectional view at A-A' and B-B' positions after depositing respective layer of thin films in the embodiment of the invention.

As shown in FIG. 5, a substrate 40 for preparing the X-Ray sensor is provided. The substrate 40 may be quartz glass, normal glass or the like. On the substrate 40, a gate layer thin film is deposited, and on the gate layer thin film a layer of photoresist is coated, the photoresist is exposed with a first mask plate and then developed to obtain a photoresist mask; the gate layer thin film is etched with the photoresist mask to obtain at least two gate scanning lines 41 of the X-Ray sensor. The number of the gate scanning lines 41 is determined according to actual requirement. In this embodiment, parts of each of the gate scanning lines 41 also serves as the gate electrodes of the switch devices included in a row of pixel units in the X-Ray sensor, which are the gate electrodes of thin film transistors in this embodiment.

The gate electrodes of the thin film transistor may also be prepared at the same time when the gate scanning lines are prepared, that is to say, the gate scanning lines do not serve as the gate electrodes of thin film transistors but is connected to the gate electrodes of the thin film transistors. In this way, the photoresist is exposed with a corresponding mask plates having a different pattern.

The gate scanning lines have a thickness of for example 100-500 nm, and may be made of one metal of chrome, molybdenum, titanium, copper, aluminum etc. or an alloy of more of the metals, for example, the alloy of molybdenum and aluminum.

The process of preparing gate scanning lines in Step S10 in FIG. 3 is accomplished with the first mask plate.

Second Photolithography Process

First, a gate insulation thin film 43, an active layer thin film 44, an ohmic contact layer thin film 45, a first conducting layer thin film 46 and a photoelectric conversion layer thin film 47 are deposited sequentially on the gate scanning line 41 prepared on the substrate 40 to obtain a lamination structure of these thin film 43-47. In this embodiment, the active layer thin film 44 is an intrinsic amorphous silicon film; the ohmic contact layer thin film 45 is a n-type amorphous silicon film. The photoelectric conversion layer thin film 47 comprises a n-type amorphous silicon film 471, an intrinsic amorphous silicon film 472 and a p-type amorphous silicon film 473, and the p-type amorphous silicon film 473 serves as a positive electrode of the photodiode 11. The gate insulation thin film 43 serves as an insulating layer between the gate electrode of the thin film transistor 12 and the source electrode and the drain electrode. The material used by the gate insulation thin film may be, for example, silicon nitride etc.

The materials used by the first conducting layer may be one metal of chrome, molybdenum, titanium, copper, aluminum etc or an alloy of more of the metals, for example, the alloy of molybdenum the aluminum. The thickness of the first conducting layer is, for example, 100-500 nm.

The cross-sectional view at A-A' and B-B' positions after depositing the respective layer of thin films described above is shown in FIG. 6.

Then, photoresist is coated on the p-type amorphous silicon film 473, and with a gray-tone mask plate, i.e., a second mask plate, the photoresist is exposed and then developed to obtain a photoresist mask 48. In the case of positive photoresist, the positions corresponding to the photodiode regions and the bias lines are not exposed, the positions corresponding to channels are partially exposed, and the rest positions are completely exposed. Correspondingly, in the process of developing, the photoresist in unexposed region is substantially retained; the photoresist in the partially exposed region is retained partially in which the exposed portion is removed; the photoresist in the completely exposed region is not retained and completely removed so as to expose the underlying thin film to be etched. Then, with the photoresist mask 48, the photoelectric conversion layer thin film 47 (the n-type amorphous silicon film 471, the intrinsic amorphous silicon film 472 and the p-type amorphous silicon film 473), the first conducting layer thin film 46, the ohmic contact layer thin film 45 (the n-type amorphous silicon film), and the active layer thin film 44 (intrinsic amorphous silicon film) are sequentially etched.

Figure 7:
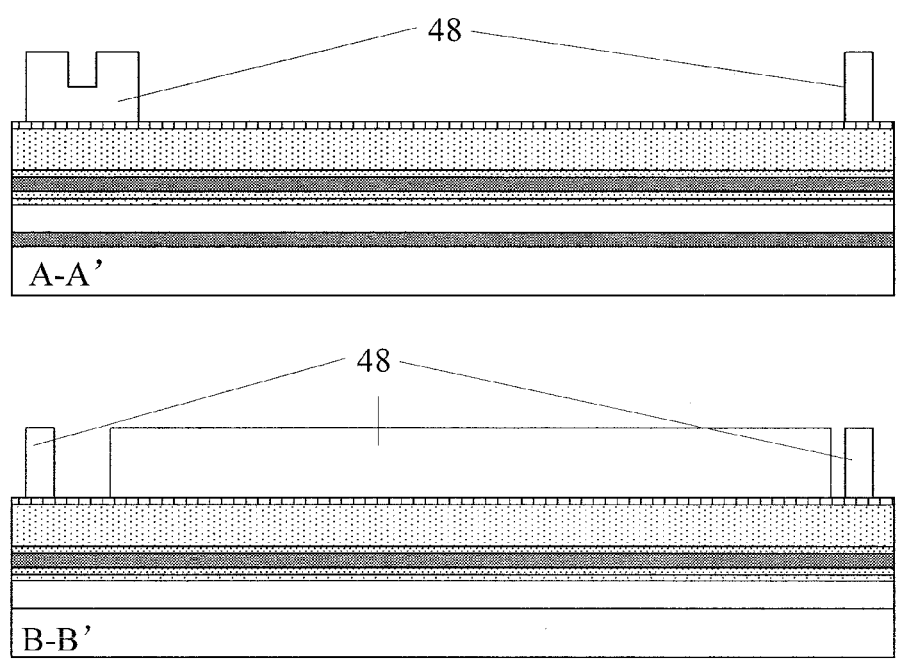
FIG. 7 is a cross-sectional view at A-A' and B-B' positions after exposing and developing photoresist in the embodiment of the invention.
Figure 8:
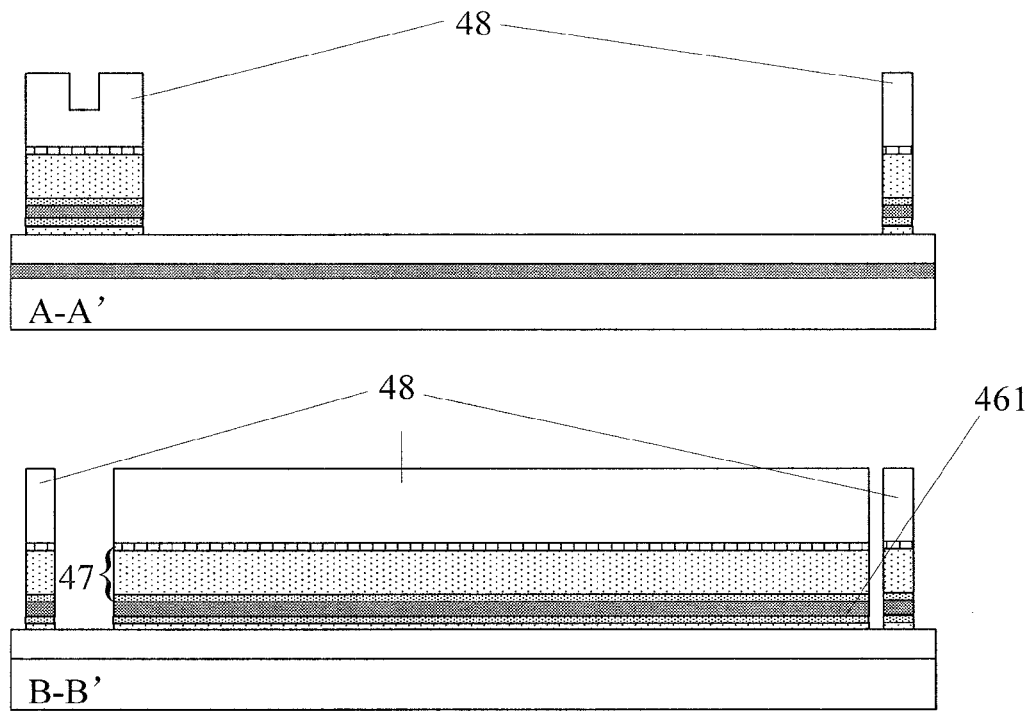
FIG. 8 is a cross-sectional view at A-A' and B-B' positions after etching respective layer of the thin films in the embodiment of the invention.

The cross-sectional view at A-A' and B-B' positions after developing is shown in FIG. 7. As shown in the figure, the respective layers of thin films under the photoresist mask 48 obtained through exposing and developing is shielded and protected by the photoresist mask 48 for forming the device. The photoresist mask obtained comprises regions with different photoresist thickness, i.e., comprises a region with a smaller thickness corresponding to the partially exposed region and a region with a greater thickness corresponding to the unexposed region. FIG. 8 is a cross-sectional view at A-A' and B-B' position after being etched. A negative electrode 461 of the photodiode is obtained from the first conducting layer thin film 46 after etching, and a photoelectric conversion layer of the photodiode is obtained from the photoelectric conversion layer thin film 47 after etching.

Figure 9:
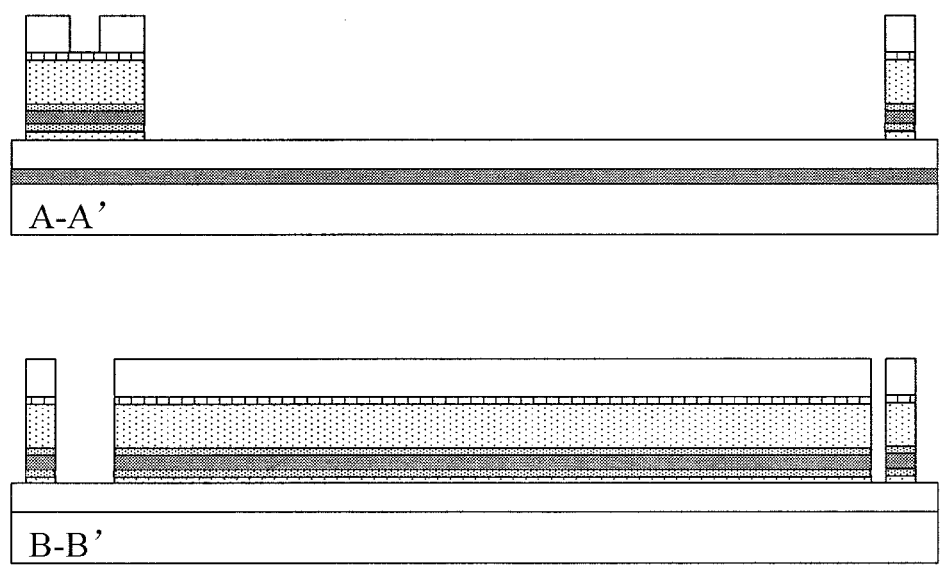
FIG. 9 is a cross-sectional view at A-A' and B-B' positions after ashing photoresist in the embodiment of the invention.

The photoresist mask 48 after exposing and developing is ashed to remove the photoresist in the region with a smaller thickness to expose the underlying thin film to be etched and retain the photoresist in the region with a greater thickness in part. The cross-sectional view at A-A' and B-B' positions after ashing is shown in FIG. 9.

With the remaining photoresist mask (i.e., the photoresist mask after ashing), the photoelectric conversion layer thin film 47 (comprising the n-type amorphous silicon film 471, the intrinsic amorphous silicon film 472 and the p-type amorphous silicon film 473) and the first conducting layer thin film 46, the ohmic contact layer thin film 45 (the n-type amorphous silicon film) and part of the portion active layer thin film 44 (the intrinsic amorphous silicon film), which are exposed after ashing, are etched to obtain a channel 49 of the thin film transistor. The thickness of the active layer thin film 44 required to be etched in this step accounts for 10% to 70% of the total thickness of the active layer thin film 44. The photoresist mask after ashing is removed to obtain the at least two data lines 42 intersecting the gate scanning lines 41, the photodiodes 11 and the thin film transistors 12 in the regions defined by the gate scanning lines 41 and the data lines 42.

Figure 10:
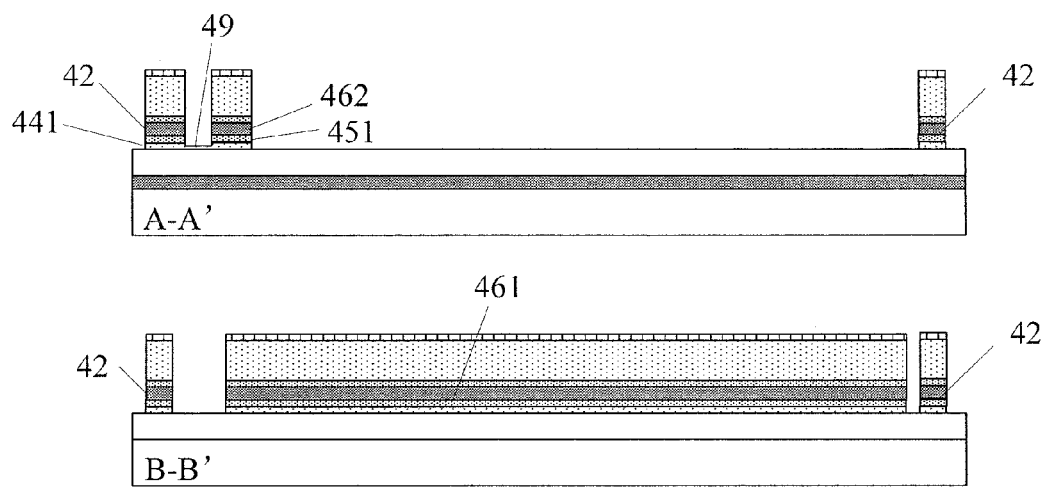
FIG. 10 is a cross-sectional view at A-A' and B-B' positions after etching to form a thin film transistor device in the embodiment of the invention.

The cross-sectional view at A-A' and B-B' positions with the photoresist is etched and that after ashing is removed is shown in FIG. 10. The data lines 42 and the source/drain electrodes of the thin film transistors 12 are obtained form the first conducting layer thin film 46 after etching. Parts of each of data lines serve as the drain electrodes of thin film transistors included in a column of pixel units in the X-Ray sensor. The source electrodes 462 of the thin film transistors are connected with the negative electrodes 461 of the photodiodes. The ohmic contact layer 451 of a thin film transistor obtained from the ohmic contact layer thin film 45 after etching is a n-type amorphous silicon layer. The active layer 441 of a thin film transistors obtained from the active layer thin film 44 after etching is a non-intrinsic amorphous silicon layer.

The manufacture for the switch device, the photoelectric sensing device and the data lines in the Step S20 in FIG. 3 is accomplished with the second mask plate.

For example, the intrinsic amorphous silicon layer of a thin film transistor has a thickness of 30-300 nm.

For example, the n-type amorphous silicon layer of a thin film transistor, the n-type amorphous silicon layer of a photodiode and the p-type amorphous silicon layer of the photodiode have thickness of 30-100 nm.

For example, the intrinsic amorphous silicon layer of the photodiode has a thickness of 500-1500 nm.

Third Photolithography Process

Figure 11:
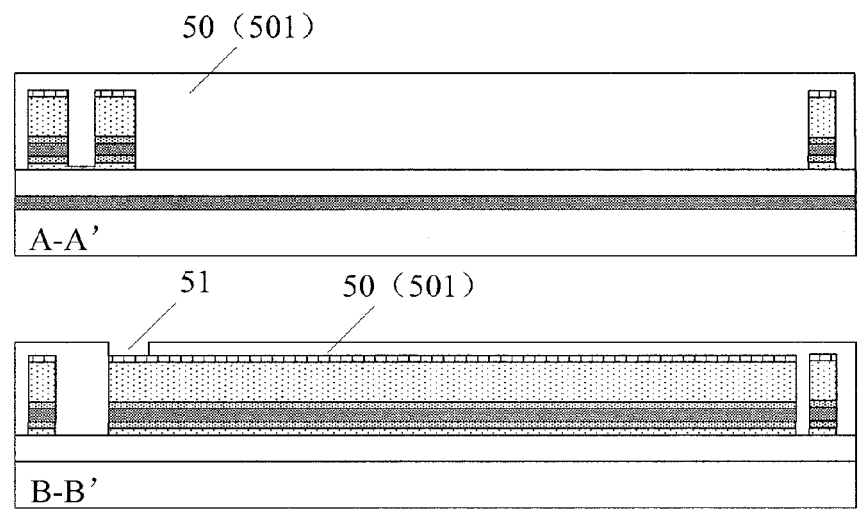
FIG. 11 is a cross-sectional view at A-A' and B-B' positions after preparing a first passivation layer and a via hole in the embodiment of the invention.

A first passivation layer thin film 50 is deposited on the photodiodes 11, the thin film transistors 12 and the gate insulation thin film 43. Photoresist is coated on the first passivation layer thin film 50, is exposed with a third mask plate and then developed to obtain a photoresist mask, and with the photoresist mask the first passivation layer thin film 50 is etched to obtain a first passivation layer 501 and via holes 51. The via holes 51 are located at predetermined positions within the region of the photodiodes 11; the positions of the via holes 51 can be referred to the plane view of FIG. 4. The predetermined positions are located within the regions of the photodiodes, may be located at edges of the photodiode regions, or may be located at centers of the photodiode regions, preferably at the edges of the photodiode regions close to the bias lines. The cross-sectional view at A-A' and B-B' position after preparing the first passivation layer and the via holes is shown in FIG. 11.

The preparing process for the first passivation layer in the Step S30 in FIG. 3 is accomplished with the third mask plate.

This first passivation layer can have functions such as water proofing, anti-corrosion of gas and the like. Through the via holes 51, part of the p-type amorphous silicon layer are exposed. The p-type amorphous silicon layer may be used as the positive electrodes of the photodiodes. Thus, this is to expose the positive electrodes of the photodiodes for subsequently connecting the photodiodes of the whole X-Ray sensor. The first passivation layer has a thickness of, for example, 150-2500 nm and may be formed of materials of silicon nitride or resin etc.

For example, photoelectric conversion layer may further comprise an Indium Zinc Oxide layer or an Indium Tin Oxide layer on the p-type amorphous silicon layer as the positive electrodes of the photoelectric sensing devices. In such a example, in the second photolithography process above, for example, the Indium Zinc Oxide layer or the Indium Tin Oxide layer is further deposited on the p-type amorphous silicon layer first to form a part of the lamination structure, and then is etched along with the p-type amorphous silicon layer etc. to be patterned.

Fourth Photolithography Process

Figure 12:
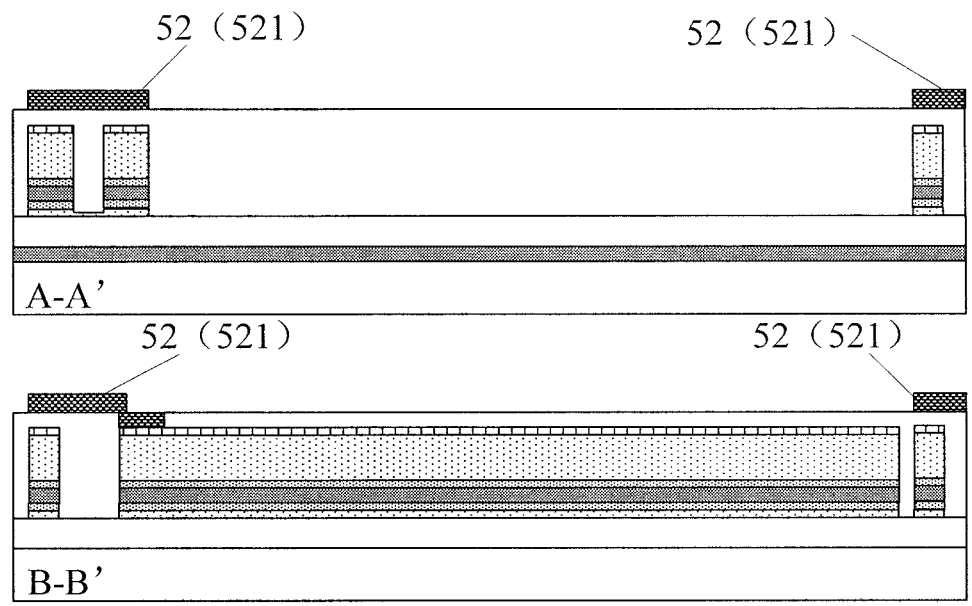
FIG. 12 is a cross-sectional view at A-A' and B-B' positions after preparing a bias line in the embodiment of the invention.

A second conducting layer thin film 52 is deposited on the first passivation layer 501 and the via holes 51. Photoresist is coated on the second conducting layer thin film 52, is exposed with a fourth mask plate mask to expose and then developed to obtain a photoresist mask, and with the photoresist mask the second conducting layer thin film 52 is etched, and the photoresist is removed to obtain a bias line 521, the position of which is shown in FIG. 4 and 12.

The bias lines function to connect all the photodiodes, that is, are used as common electrodes. The bias lines manufactured may cover the underlying data lines and thin film transistors to prevent the external light from irradiating on the thin film transistors serving as the switch elements in the operation of the obtained device, and therefore to prevent resultant photovoltaic effect which causes leakage current, such that the whole device can reach a better effect. The bias lines have a thickness of, for example, 100-500 nm and may be formed of one metal of chrome, molybdenum, titanium, copper, aluminum, etc. or an alloy of more of the metals, for example, the alloy of molybdenum and aluminum.

The preparing process of bias line in Step S40 in FIG. 3 is accomplished with the fourth mask plate.

Fifth Photolithography Process

Figure 13:
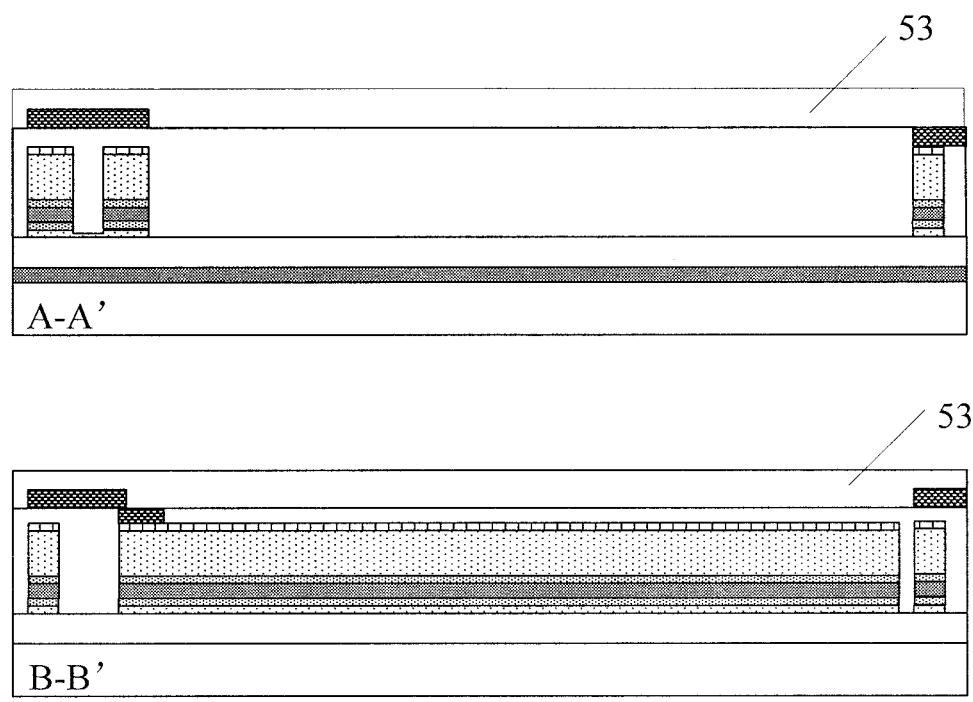
FIG. 13 is a cross-sectional view at A-A' and B-B' positions after preparing a second passivation layer in the embodiment of the invention.

With a fifth mask plate, a second passivation layer 53 covering the bias lines 521 and the first passivation layer 501 may be prepared in the following two ways. In the first way, a photosensitive material layer is deposited or coated on the bias lines 521 and the first passivation layer 501, and the photosensitive material is exposed with a mask, developed and dried to obtain the second passivation layer 53. In the second way, a non-photosensitive material layer is deposited on the bias lines 521 and the first passivation layer 501, photoresist is coated on the non-photosensitive material layer, and the photoresist is exposed with a mask and developed to obtain a photoresist mask, and with the photoresist mask the non-photosensitive material layer is etched to obtain the second passivation layer 53. The cross-sectional view at A-A' and B-B' positions after preparing the second passivation layer is shown in FIG. 13.

The preparing process of the second passivation layer in Step S50 in FIG. 3 is accomplished with the fifth mask plate.

The second passivation layer, which serves as an insulating layer, is used to protect the whole device, the material of which may be silicon nitride or resin, and the thickness of which is, for example, 150-2500 nm.

As compared with the prior art, the method of preparing an X-Ray sensor in this embodiment comprises first preparing the gate scanning lines on the substrate, then depositing the gate insulating layer on the gate scanning lines, sequentially depositing the gate insulation thin film, the active layer thin film, the ohmic contact layer thin film, the first conducting layer thin film, and the photoelectric conversion layer thin film, after depositing, using a gray-tone mask plate process to process the lamination structure of the thin films deposited to obtain the switch devices and the photoelectric sensing devices, and then sequentially preparing the first passivation layer, bias lines and the second passivation layer. The method uses one mask plate respectively for preparing the gate scanning lines, preparing the switch devices and the photoelectric sensing devices by using the gray-tone photolithography process, preparing the first passivation layer, preparing the bias lines and preparing the second passivation layer, so that five mask plates are needed totally to complete the steps of the method of this embodiment. Since the costs of the mask plate are high, with respect to the case in which 11 mask plates are needed for preparing an X-Ray sensor in the prior art, the method of embodiment reduces costs of products. Since the number of the mask plates used is reduced, the corresponding processes are simplified, which reduces damage rate of products so as to enhance yield and productivity of equipments.

Figure 14:
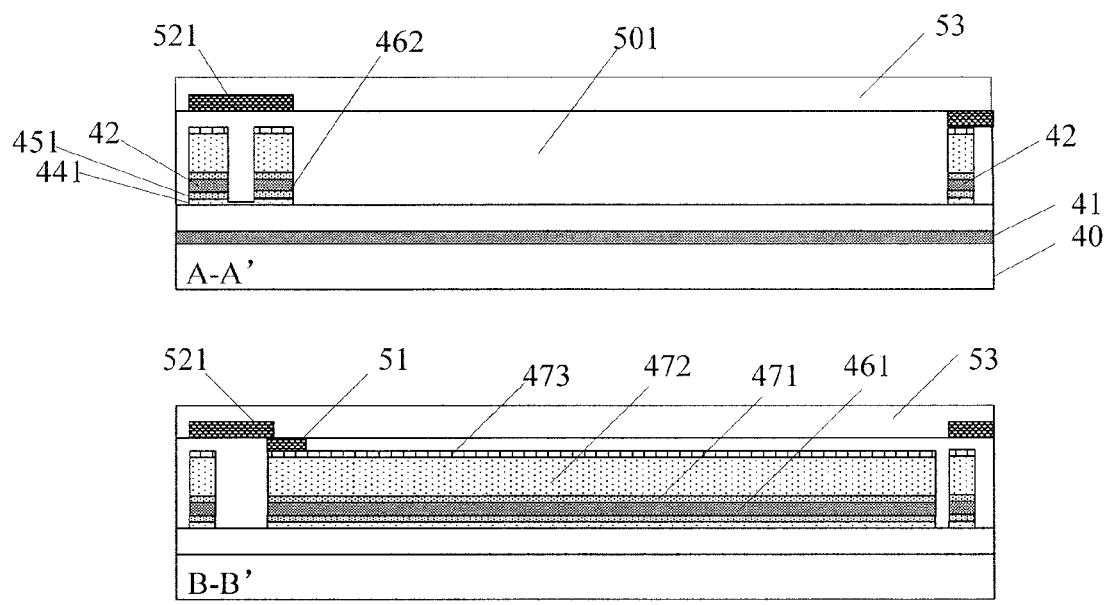
FIG. 14 is a cross-sectional view at A-A' and B-B' positions of one pixel unit of the X-Ray sensor in the embodiment of the invention.

Based on the manufacture method of the X-Ray sensor provided by the above embodiment, the embodiment of the invention also provides an X-Ray sensor. The top view of an pixel unit of the X-Ray sensor of the invention is shown in FIG. 4. The X-Ray sensor of the invention is shown in FIG. 14. The cross-sectional view at A-A' and B-B' positions is shown in FIG. 4.

The above X-Ray sensor comprises a data driving circuit 15, a scan driving circuit 16 and a photosensitive array, and the photosensitive array comprises a substrate 40 and pixel units formed on the substrate arranged in an array. At least two gate scanning lines 41 are located on the substrate 40, on end of each of which is connected to the scan driving circuit 16; at least two data lines 42 intersect the gate scanning lines 41 and one end of each of data lines 42 is connected to the data driving circuit 15. The intersecting of the gate scanning lines 41 and the data lines 42 defines the array of the pixel units. Each of the pixel units comprises a photoelectric sensing device 11 in a region defined by a gate scanning line 41 and a data line 42 and a switch device 12 on the gate scanning line 41 and provided in pair with the photoelectric sensing device. Here, the photoelectric sensing device 11 and the switch device 12 are provided in pair in the pixel unit of the X-Ray sensor. For example, the source electrode of the switch device 462 is connected to the negative electrode of photoelectric sensing device 461, each of data lines 42 serves as the drain electrodes of the switch devices of a column of pixel units in the X-Ray sensor, and each of the gate scanning line 41 serves as the gate electrodes of switch device of a row of pixel units in the X-Ray sensor. The first passivation layer 501 covers the switch devices and the photoelectric sensing devices, on which via holes 51 are provided. The via holes 51 are located at predetermined positions within the photoelectric sensing device regions. The bias lines 521, which are connected to the photoelectric sensing devices 11 electrically through the via holes 51, are provided on the first passivation layer 501 at positions corresponding to the data lines 42 and the switch devices. The second passivation layer 53 covers the bias lines 521 and the first passivation layer 501. Preferably, the photoelectric sensing device is, for example, a photodiode 11 and the switch device is, for example, a thin film transistor 12.

As shown in FIG. 14, the active layer 441 of the thin film transistor is an intrinsic amorphous silicon layer; the ohmic contact layer 451 of the thin film transistor is a n-type amorphous silicon layer. The photoelectric conversion layer 47 of the photodiode 11 comprises a n-type amorphous silicon layer 471, an intrinsic amorphous silicon layer 472, and a p-type amorphous silicon layer 473 which serves as the positive electrode of photodiode.

For example, the photoelectric conversion layer may further comprise an Indium Zinc Oxide layer or Indium Tin Oxide layer on the p-type amorphous silicon layer serving as the positive electrode of the photoelectric sensing device.

The structure and the operation principle of the X-Ray sensor will be explained in detail by taking a photodiode as the photoelectric sensing device and a thin film transistor as the switch device for an example in the following.

Figure 1:
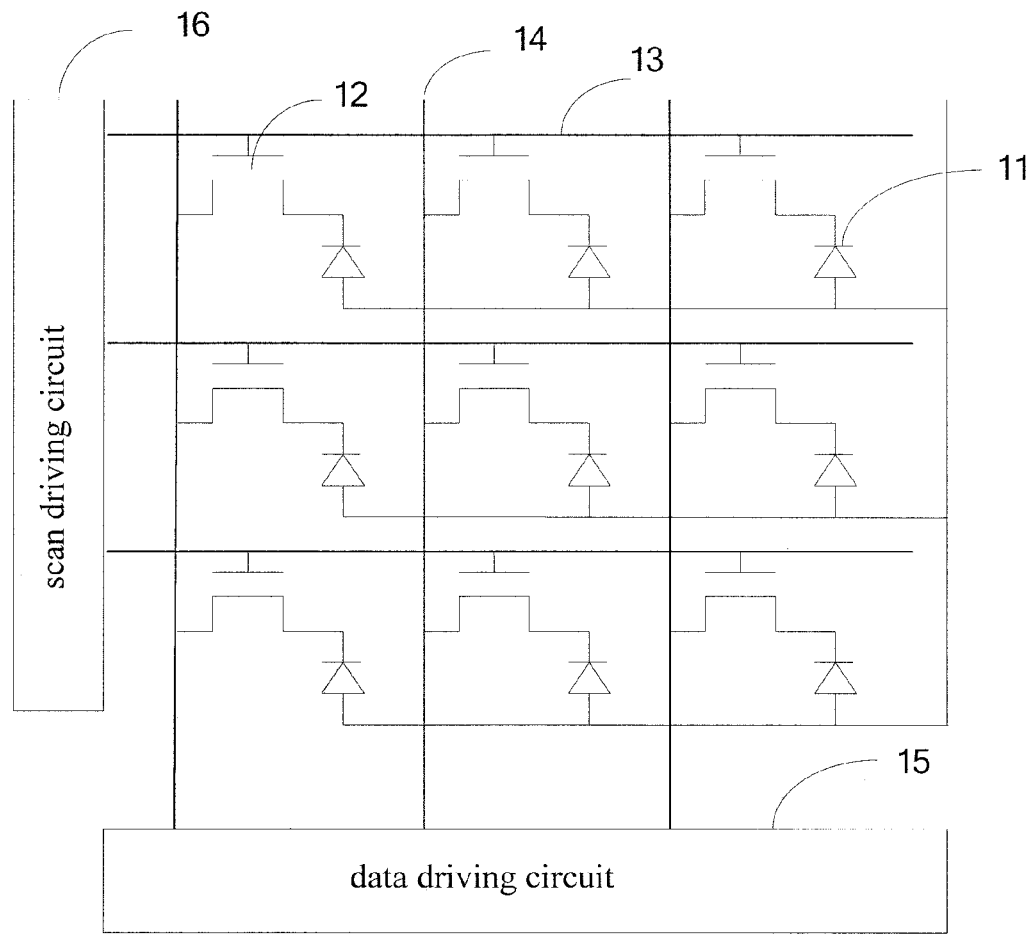
FIG. 1 is a schematic circuit diagram of a conventional X-Ray sensor.
Figure 2:
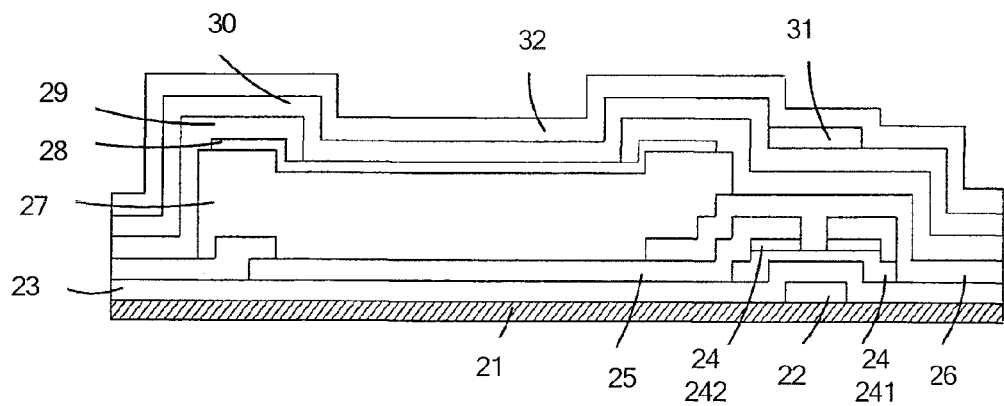
FIG. 2 is a cross-sectional view of one pixel unit of the conventional X-Ray sensor.

The equivalent circuit schematic diagram of the X-Ray sensor of an embodiment of the invention is identical to the equivalent circuit diagram of the conventional X-Ray sensor, as shown in FIG. 1, but the detailed implementations are different. The X-Ray sensor comprises a data driving circuit 15, a scan driving circuit 16, a plurality of data lines 14 (i.e., the data lines 42 in FIG. 4) paralleled to each other which are connected to the data driving circuit 15, and a plurality of gate scanning lines 13 (i.e., the gate scanning lines 41 in FIG. 4) paralleled to each other which are connected to the scan driving circuit 16. The spaces divided by the intersecting of the data lines 14 and the gate scanning lines 13 form pixel units. Thin film transistors 12 are formed at positions of the intersecting of the data lines 14 and the gate scanning lines 13. Each of the pixel units comprises a photodiode 11 and a thin film transistor 12. A part of a gate scanning line may be used as the gate electrode of the thin film transistor as well, a part of a data line may be used as the drain electrode of the thin film transistor as well, the source electrode of the thin film transistor is connected to the negative electrode of the photodiode, and the positive electrode of the photodiode is connected to a bias line.

The operation principle of the X-Ray sensor is as follows. When the X-Ray sensor is irradiated by X-Ray, the photosensitive devices in respective pixel units perform photoelectric conversion to obtain photo-charges which are stored in the pixel units. At different positions on the X-Ray sensor there may be different X-Ray strength so that the amount of the photo-charges generated may be different. In reading the photo-charges stored in the X-Ray sensor, the scan driving circuit applies driving scan signals via the gate scanning lines to control the switch states of the thin film transistors in the pixel units of the photosensitive array. When the thin film transistors are switched on, the photocurrent signals generated by the photodiodes are read by the data driving circuit via the data lines connected to the thin film transistors. The collection of the photoelectric signals is accomplished by controlling the signal timings of the gate scanning lines and the data lines, i.e., the control on the collection of the photocurrent signals generated by the photoelectric photodiodes is accomplished by controlling the switch states of the thin film transistors. For example, the scan driving circuit may use progressive scan, or may use interlaced scan. When the arrays of the pixel units of the whole X-Ray sensor are read, the information of the whole picture can be obtained, i.e., one image. The current signals that are read out may be amplified and analog-digital (A/D) converted, and thus the capture, storage, transmission, processing and reproduction of the image can be realized.

The sensor and the manufacturing method according to the embodiments of the invention are not limited to X-ray sensor; with an appropriately selected photoelectric conversion layer thin film for the photoelectric sensing device, the resultant sensor can be applied to visible light or non-visible light (e.g., infrared ray) as well, and even to electron beam. The photoelectric conversion layer thin film for example doped and/or intrinsic monocrystalline silicon, poly-silicon or amorphous silicon.

It is obvious that those skilled in the art can make various modifications and variations for the present invention without departure from the spirit and scope of the invention. If the modifications and variations of the invention fall within the scope of the claims and the equivalents thereof the invention, apparently such modifications and variations are intended to be included within the scope of the invention.

The invention claimed is:

1. A manufacture method of a sensor comprising a plurality of pixel units arranged in an array, each of which comprises a switch device and a photoelectric sensing device, the method comprising:

preparing at least two gate scanning lines and gate electrodes of the switch device of a row of pixel units connected to each of the gate scanning lines on a substrate;

sequentially depositing a gate insulation thin film, an active layer thin film, an ohmic contact layer thin film, a first conducting layer thin film and a photoelectric conversion layer thin film on the substrate and the gate scanning lines; performing a same photolithography process on a lamination structure of the active layer thin film, the ohmic contact layer thin film, the first conducting layer thin film and the photoelectric conversion layer thin film by using a gray-tone mask to obtain at least two data lines intersecting the gate scanning lines, the photoelectric sensing devices and the switch devices, each of the data lines is connected to drain electrodes of the switch devices of a column of pixel units in the sensor, and source electrodes of the switch device are connected to negative electrodes of the photoelectric sensing devices;

preparing a first passivation layer covering the photoelectric sensing devices and the switch devices, and preparing via holes on the first passivation layer, which are located at predetermined positions in regions of the photoelectric sensing devices;

preparing bias lines on the first passivation layer at positions corresponding to the data lines and the switch devices, the bias lines being electrically connected to the photoelectric sensing devices through the via holes; and preparing a second passivation layer covering the bias lines and the first passivation layer.

2. The method according to claim 1, wherein processing using the gray-tone lithography to obtain the at least two data lines intersecting the gate scanning lines, photoelectric sensing devices and the switch devices comprising:

coating photoresist on the photoelectric conversion layer thin film, exposing and developing the photoresist using a gray-tone mask plate to obtain a photoresist mask, etching the lamination structure of the photoelectric conversion layer thin film, the first conducting layer thin film, the ohmic contact layer thin film and the active layer thin film structure with the photoresist mask;

ashing the exposed and developed photoresist, removing the photoresist in a region with a smaller thickness, and remaining the photoresist in region with a greater thickness, to obtain a photoresist mask after ashing;

etching the photoelectric conversion layer thin film exposed after ashing as well as the first conducting layer thin film, the ohmic contact layer thin film and part of the active layer thin film below the photoelectric conversion layer thin film with the photoresist mask after ashing, to obtain a channel of switch device; and removing the photoresist mask after ashing so as to obtain at least two data lines intersecting the gate scanning lines, the photoelectric sensing devices and the switch devices in the regions defined by the gate scanning lines and the data lines.

3. The method according to claim 1, wherein preparing the second passivation layer covering the bias lines and the first passivation layer comprising:

depositing a photosensitive material layer on the bias lines and the first passivation layer, with the photosensitive material layer being mask-exposed, developed and dried to obtain the second passivation layer; or depositing a non-photosensitive material layer on the bias lines and the first passivation layer, coating photoresist on the non-photosensitive material layer, and exposing and developing the photoresist to obtain a photoresist mask, and etching the non-photosensitive material layer to obtain the second passivation layer.

4. The method according to claim 1, wherein the photoelectric sensing devices is a photodiode and the switch device is a thin film transistor.

5. The method according to claim 4, wherein the active layer of the thin film transistor is an intrinsic amorphous silicon layer;

the ohmic contact layer of the thin film transistor is a n-type amorphous silicon layer; and the photoelectric conversion layer of the photodiode comprises an n-type amorphous silicon layer, an intrinsic amorphous silicon layer and a p-type amorphous silicon layer, wherein the p-type amorphous silicon layer serves as a positive electrode of the photodiode.

6. The method according to claim 5, wherein the photoelectric conversion layer further comprises an Indium Zinc Oxide layer or Indium Tin Oxide layer located on the p-type amorphous silicon layer serving as the positive electrode of the photoelectric sensing device.

7. The method according to claim 5, wherein the intrinsic amorphous silicon layer of the thin film transistor has a thickness of 30-300 nm.

8. The method according to claim 5, wherein the n-type amorphous silicon layer of the thin film transistor has a thickness of 30-100 nm.

9. The method according to claim 5, wherein the n-type amorphous silicon layer of the photodiode has a thickness of 30-100 nm.

10. The method according to claim 5, wherein the p-type amorphous silicon layer of the photodiode has a thickness of 30-100 nm.

11. The method according to claim 5, wherein the intrinsic amorphous silicon layer of the photodiode has a thickness of 500-1500 nm.

12. The method according to claim 1, wherein the gate scanning line, the first conducting layer and the bias line have thickness of 100-500 nm.

13. The method according to claim 1, wherein the first passivation layer and the second passivation layer have thickness of 150-2500 nm.

14. The method according to claim 1, wherein the sensor is an X-ray sensor.

* * * * *